(12) United States Patent
Kawasaki et al.

(10) Patent No.: US 6,288,322 B1
(45) Date of Patent: Sep. 11, 2001

(54) ELECTRIC ELEMENTS

(75) Inventors: Shinji Kawasaki, Nagoya; Kiyoshi Okumura; Shigenori Ito, both of Kasugai, all of (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/504,586

(22) Filed: Feb. 15, 2000

(30) Foreign Application Priority Data

Feb. 16, 1999 (JP) .................................................. 11-037419

(51) Int. Cl.⁷ ..................................................... H01L 35/30
(52) U.S. Cl. ......................... 136/205; 136/208; 136/236.1
(58) Field of Search ................................... 136/203, 205, 136/236.1, 208

(56) References Cited

U.S. PATENT DOCUMENTS 4,275,259 * 6/1981 Yamamoto et al. .................. 136/209

FOREIGN PATENT DOCUMENTS

| 0 773 592 A2 | 5/1997 | (EP) . |
| 196 46 905 A1 | 5/1997 | (DE) . |
| 2 033 659 A | 5/1980 | (GB) . |
| 2 160 358 A | 12/1985 | (GB) . |
| 55-53470 | 4/1980 | (JP) . |
| WO 97/44993 | 11/1997 | (WO) . |

* cited by examiner

Primary Examiner—Kathryn Gorgos
Assistant Examiner—Thomas H Parsons
(74) Attorney, Agent, or Firm—Parkhurst & Wendel, L.L.P

(57) ABSTRACT

A honeycomb-shaped electric element includes a honeycomb-shaped structural body, the honeycomb-shaped structural body including crossing partition walls defining a number of through-holes arranged thereamong, the through-holes being arranged in at least three lines extending laterally substantially in the same direction, wherein partition wall portions of the through-holes in the at least three lines are made of at least an electrically conductive material and an insulating material such that the partition wall portions of the through-holes made of the electrically conductive material and those of the insulating material are so arranged that a current flow passage may be continuously formed in the same direction as the continuous lines extend.

8 Claims, 2 Drawing Sheets

ELECTRIC ELEMENTS

BACKGROUND OF THE INVENTION

1. Field of the Invention

The present invention relates to honeycomb-shaped electric elements and honeycomb-shaped thermoelectric elements having a plurality of through holes.

2. Description of the Related Art

Recently, thermoelectric elements as one kind of electric elements have been rapidly developed for effective use of unused energy. The thermoelectric element has been desired to have greater electric power generation from the standpoint of increasing the energy conversion rate.

In order to enhance the electric powder generating rate, there is a method in which thermoelectric element units are connected to one another in series and in parallel to form a thermoelectric element composite composed of a plurality of the thermoelectric element units. Further, as described in JP-A 55-53,470 of NGK Insulators, Ltd., there is also available a method for obtaining a large amount of the electric power by a structure in which thermoelectric element units are formed from honeycomb-shaped structural bodies made of a p-type or n-type semiconductor material such that a part of each of the honeycomb-shaped structural bodies is designed as a high temperature fluid-passing zone, and the remainder as a low temperature fluid-passing zone to form a large temperature difference in the single thermoelectric element unit, and a plurality of the honeycomb-shaped structural bodies are connected to one another in series.

However, the method in which a plurality of the thermoelectric element units are connected to one another in series and in parallel, contact resistance occurs in joints between the adjacent thermoelectric element units preventing generation of sufficient electric power for the size of the entire thermoelectric element.

Further, the method described in JP 55-53,470 has the problems that the thermoelectric element becomes bulky due to the series connection, and that sufficient electric power generated cannot be generated relative to the size of the thermoelectric element.

SUMMARY OF THE INVENTION

The present invention is aimed at the provision of an electric element that has a higher output density per unit volume and can give a high output even in a relatively small, size as well as the providing a thermoelectric element that has a high electric power generating rate per unit volume and can give a high output even in a relatively small size.

The present invention relates to a honeycomb-shaped electric element comprising a honeycomb-shaped structural body, the honeycomb-shaped structural body including crossing partition walls defining a number of through-holes arranged thereamong, the through-holes being arranged in at least three lines extending laterally substantially in the same direction, wherein partition wall portions of the through-holes in the at least three lines are made of at least an electrically conductive material and an insulating material such that the partition wall portions of the through-holes made of the electrically conductive material and those of the insulating material are so arranged that a current flow passage may be continuously formed in the same direction as the continuous lines extend. The current flow passage is preferably in a wavy form through the partition wall portions of the through-holes between a first line of the through-hole and a third line of the through-holes via a second line of the through-holes, the first, second and third lines being arranged in this order.

The present invention preferably relates to the honeycomb-shaped electric element, wherein the electric element comprises a plurality of electric element units provided inside the honeycomb-shaped structural body, the electric element units comprise the electrically conductive material and the insulating material, and a plurality of the electric element units are connected to one another in series and in parallel to form a circuit.

The present invention also relates to a honeycomb-shaped thermoelectric element comprising the above honeycomb-shaped electric element, in which the electrically conductive material comprises a p-type semiconductor material and an n-type semiconductor material, the thermoelectric element comprises a plurality of thermoelectric element units provided inside the honeycomb-shaped structural body, the thermoelectric element units comprise the p-type semiconductor material, the n-type semiconductor material and the insulating material, and a plurality of the thermoelectric element units are connected to one another in series and in parallel to form a circuit.

These and other objects, features and advantages of the invention will be appreciated upon reading the following description of the invention when taken in conjunction with the attached drawings, with the understanding that some modifications, variations and changes of the same could be easily made by the skilled person in the art to which the invention pertains.

BRIEF DESCRIPTION OF THE DRAWINGS

For a better understanding of the invention, reference is made to the attached drawings, wherein.

DETAILED DESCRIPTION OF THE INVENTION

Figure 1:
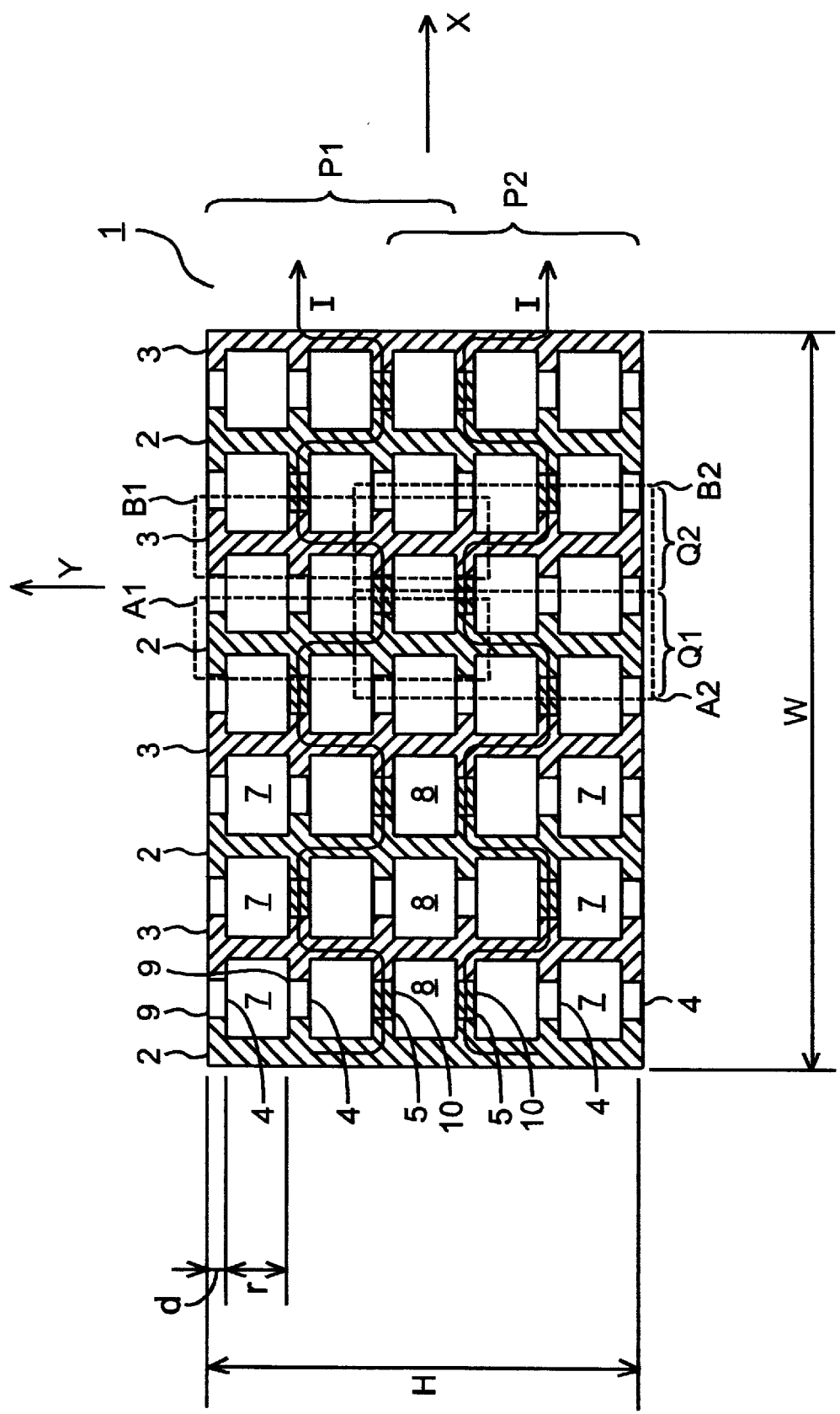
FIG. 1 is a sectional view of an embodiment of the honeycomb-shaped thermoelectric element according to the present invention.

The honeycomb-shaped electric element according to the present invention is applicable to Peltier elements, electric heaters, electrochemical cells, etc. If the Peltier element using the invention honeycomb-shaped electric element is used in a refrigerator or a cooler box, the element exhibits a high cooling efficiency and strong resistance against cooling/stopping cyclings. If the electric heater uses the invention electric element, the heater remains structurally strong against the cyclings through heating/stopping as well as a high efficiency for heating a gas fed to the honeycomb structure. Further, the electrochemical cell using the invention electric element can be used as a substrate for a fuel cell or an electrolysis cell, and exhibits a high heat-cycling durability as a solid oxide fuel cell (SOFC), steam/NOx electrolyte cell.

First, the honeycomb-shaped structural body in the present invention will be explained.

The honeycomb-shaped structural body includes crossing partition walls defining a number of through-holes arranged thereamong in such a manner as determined by the sectional shape of each of the through-holes. The through-holes are arranged in at least three lines extending laterally substantially in the same direction. Each of the first, second and third lines arranged in this order comprises at least one stage of the through-holes. Partition wall portions of the through-holes in these three lines are made of at least an electrically conductive material and an insulating material, wherein the partition wall portions of the through-holes made of the electrically conductive material and those of the insulating material are arranged such that a current flow passage may be continuously formed in the same direction as the continuous lines extend. The current flow passage is preferably formed in a wavy form through the partition wall portions of the through-holes between the first line of the through-hole and the third line of the through-holes via the second line of the through-holes. The wavy form of the current flow passage includes a smooth wave-repeating form, a rectangular wave-repeating form, a triangular wave-repeating shape, a trapezoidal wave-repeating form, or a combination thereof, etc. The second line of the through-holes functions, for example, as a shield layer to hinder transmission of heat or the like between the first and third lines of the through-holes. So long as such function is ensured, the second line of the through-holes may be partially or entirely filled with a material such as a heat-insulating material having a small heat conductivity. Further, the phrase "a current flow passage may be continuously . . . formed in a wavy form through the partition wall portions of the through-holes between the first line of the through-hole and the third line of the through-holes via the second line of the through-holes" means that the current flow passage continuously passes . . . , a partition wall of a through-hole 8 in the third line, a partition wall of a through-hole in the second line, a partition wall of a through-hole 7 in the first line, a partition wall of a through-hole in the second line, a partition wall of a through-hole in the third line, . . . One wave is considered to form an electric unit, so that such electric units are connected in series along the wavy current flow passage.

Further, the honeycomb-shaped structural body in the present invention may include two or more sets of such continuous lines of the through-holes, which lines extend substantially in the same direction in the order of the first, second and third lines. If two sets of the first, second and third continuous lines are employed, the first line, the second line, the third line, the second line and the first line of the through-holes extend substantially in the same direction (In this case, the third line is overlapped between the two sets). The other structure is substantially the same as that explained just above. In the case of two sets of continuous lines of the through-holes, two wavy current flow passages are continuously formed, each in one set of the continuous lines. When one wave forms an electric unit, such electric units may be connected in series and in parallel along the wavy current flow passage.

Figure 2:
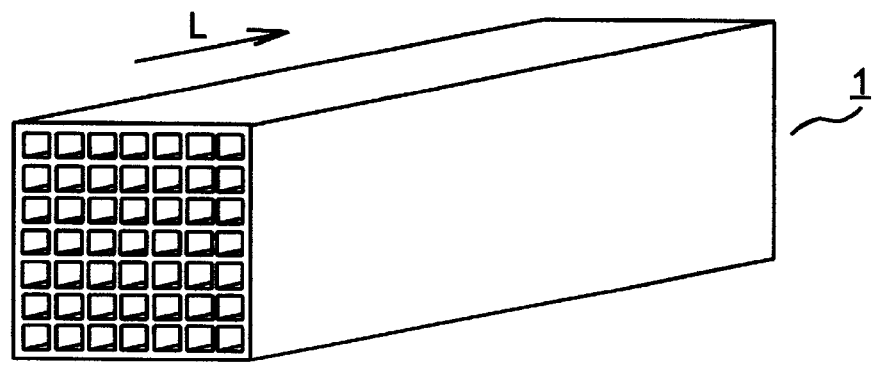
FIG. 2 is a perspective view outlining the honeycomb-shaped thermoelectric element according to the present invention.

FIG. 1 is a sectional view of an embodiment of the honeycomb-shaped thermoelectric element according to the present invention. FIG. 2 is a perspective outline view of the honeycomb-shaped thermoelectric element of the present invention. The honeycomb-shaped thermoelectric element shown in FIG. 1 is constituted by a honeycomb-shaped structural body 1, which includes first through-holes 7 and second through-holes 8.

This embodiment has vertically five lines of the through-holes and laterally seven columns of the through-holes, first, third and fifth lines are constituted by the through-holes 7, the through-holes 8 and the through-holes 7, respectively. In this embodiment, there are two kinds of vertically extending partition walls that are made of a p-type semiconductor material 2 and an n-type semiconductor material 3, respectively, and which are alternatively arranged as shown in FIG. 1, while each the partition walls extends at specific intervals to form parts of laterally extending partition walls, respectively. Two wavy current passages are defined through the through-holes and are continuously formed in the same direction as the continuous lines of the through-holes extend and each in a wavy form through the partition wall portions of the through-holes between the first line of the through-hole and the third line of the through-holes via the second line of the through-holes. For this purpose, there are provided two kinds of through-holes 7: one with a central portion of each of upper and lower partition wall portions being made of an insulating material 4 and the other with central portions of upper and lower partition wall portions being made of the insulating material 4 and an electrically conductive material 5, respectively, for the first line and vice versa for the fifth line. These two kinds of the through-holes 7 are laterally alternatively arranged. There are also provided two kinds of the through-holes 8: one with a central portion of each of upper and lower partition wall portions being made of the insulating material 4 and the other with a central portion of each of upper and lower partition wall portions being made of the electrically conductive material 5. These two kinds of through-holes 8 are laterally alternatively arranged. In FIG. 1, the first through-hole 7 includes a pair of upper and lower partition wall portions 9, and a partition wall constituting the second through-hole 8 includes a pair of upper and lower partition wall portions 10.

The electrically conductive material 5 functions to strength the honeycomb-shaped structure, ensuring electric contact between the p-type semiconductor material 2 and the n-type semiconductor material 3 over a wide range of high temperatures to low temperatures, and constitute a part of the circuit. The insulating material 4 and the electrically conductive material 5 are selectively arranged at the central portions of the lateral partition walls so that a wavy current flow path may be formed. As the electrically conductive material 5, not only metals such as platinum, cobalt, nickel, copper, zinc, iron and lead but also the p-type semiconductor material and the n-type semiconductor material may be employed. The electrically conductive material 5 preferably has conductivity of not less than 1 S/cm, more preferably 10 S/cm. The higher the conductivity, the smaller the ohmic loss to raise the power generating efficiency.

With the above construction, the honeycomb-shaped structural body 1 has a structure in which the p-type semiconductor material 2 and the n-type semiconductor material 3 are laterally alternatively laminated, while adjacent layers of the p-type semiconductor material 2 and the n-type semiconductor material 3 are connected to each other through the insulating material 4 and the conductive material 5 at opposite ends thereof, respectively to form the two wavy current flow passages laterally extending.

In FIG. 1, a low-temperature gas flows through the first through-holes 7, whereas a high-temperature gas flows through the second through-holes 8. In each of the p-type semiconductor material 2 and the n-type semiconductor material 3, a difference in temperature occurs owing to the high-temperature gas flowing through the first through-holes 7 and the low-temperature gas flowing through the second through-holes 8. An electromotive force is generated according to a Seebeck effect based on this temperature difference between the P1 and the P2 inside each of the semiconductor materials.

That is, according to the thermoelectric element shown in FIG. 1, thermoelectric element units are constituted by portions A1, A2, B1 and B2 defined by the p-type semiconductor material 2 and the n-type semiconductor material 3 in ranges of widths Q1 and Q2 and distances P1 and P2, respectively.

Since the p-type semiconductor material 2 and the n-type semiconductor material 3 which constitute the honeycomb-shaped structural material 1 are alternatively laminated through the insulating material 4 and the electrically conductive material 5 as described above, currents which correspond to an electromotive forces generated in the respective semiconductor materials between P1 and P2 flow between the adjacent p-type semiconductor material 2 and n-type semiconductor material 3 through the conductive material 5, so that the currents I flows inside the honeycomb-shaped structural body 1 in one direction as shown in FIG. 1 through respective wavy current flow routes.

The current is taken out through a copper wire connected to the honeycomb-shaped structural body.

Figure 3:
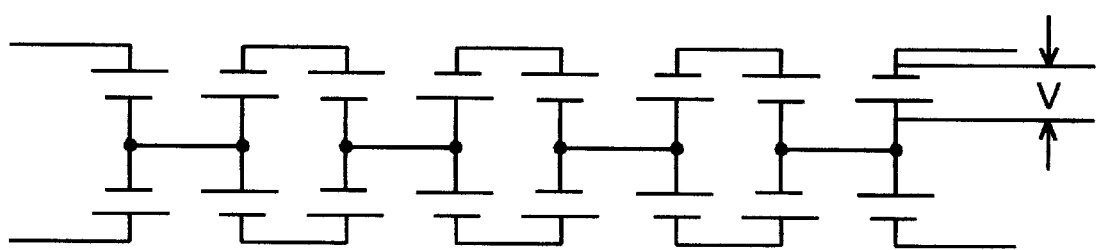
FIG. 3 is a diagram showing a circuit equivalent to the thermoelectric element in FIG. 1.

As mentioned above, the thermoelectric element units of the thermoelectric element shown in FIG. 1 are constituted by the portions A1, A2, B1 and B2 defined by the p-type semiconductor material 2 and the n-type semiconductor material 3 in ranges of widths Q1 and Q2 and distances P1 and P2, respectively. Therefore, the thermoelectric units elements are connected in parallel as viewed in an X-direction in FIG. 1, while being connected in series in a Y-direction. That is, the thermoelectric element in FIG. 1 is equivalent to a circuit shown in FIG. 3. An electromotive force V shown in FIG. 3 corresponds to each of the thermoelectric element units A1, . . .

As mentioned above, the thermoelectric element shown in FIG. 1 is constituted by a single honeycomb-shaped structural body 1. Further, each of the thermoelectric element units is constituted directly by the materials constituting the honeycomb-shaped structural body 1 in such a manner that the thermoelectric elements are naturally directed to one another in series and in parallel. As a result, the vertically adjacent thermoelectric element units commonly possess the second through-hole 8 so that the number of the thermoelectric element units contained in a unit volume is extremely large.

Therefore, the electric power generation amount per unit volume is larger as compared with that of the conventional thermoelectric elements, so that the electric power generation amount of the entire thermoelectric element is extremely larger as compared with that of the conventional thermoelectric element.

In the thermoelectric element described in JP-A 55-53470, the honeycomb-shaped structural body is constituted by the p-type or n-type semiconductor material alone, and one thermoelectric element unit is formed by the entire honeycomb-shaped structural body. To the contrary, the honeycomb-shaped thermoelectric element according to the present invention differs from JP-A 55-53,470 in that the honeycomb-shaped thermoelectric element, the honeycomb-shaped structural body is constituted by the p-type and n-type semiconductor materials and the insulating material, and that the thermoelectric element possesses a plurality of the thermoelectric element units within the honeycomb-shaped structural body.

In the following, the present invention will be explained in more detail along with an embodiment of the present invention with reference to the drawings.

FIG. 1 is a sectional view of an embodiment of the honeycomb-shaped thermoelectric element according to the present invention, and FIG. 2 is a perspective view of outlining the honeycomb-shaped thermoelectric element according to the present invention.

The honeycomb-shaped structural body 1 shown in FIG. 1 has a rectangular parallelpiped shape. However, the configuration of the honeycomb-shaped structural body in the present invention is not limited to any particular one, and any configuration can be employed depending upon uses.

With respect to a plurality of the through-holes including the first through-holes 7 and the second through-holes 8 inside the honeycomb-shaped structural body, besides the square sectional shape, any sectional shape such as an isosceles triangular sectional shape, and equilateral triangular sectional shape, a rectangular sectional shape, a equilateral hexagonal sectional shape or the like may be used so long as the honeycomb-shaped structural body 1 can be effectively used depending upon the use.

The p-type semiconductor material 2 is not particularly limited, at least one kind of cobalt oxide, lanthanum ferrite, lanthanum manganite, silicon germanium, cobalt antimony, bismuth tellurium, lead tellurium and iron silicide is preferred because each of them has a high performance index representing an energy conversion efficiency.

The n-type semiconductor material 3 is not particularly limited, at least one kind of lanthanum cobaltite, lanthanum chromite, silicon germanium, cobalt antimony, bismuth tellurium, lead tellurium and iron silicide is preferred for the above reason.

Further, the insulating material 4 is preferably an insulate ceramic material to effectively insulate a joined portion between the above p-type semiconductor material 2 and the n-type semiconductor material 3 and thereby preventing reduction in the amount of generated electric power due to conduction. As the insulating ceramic material, silica, alumina and mullite may be recited by way of example.

In the thermoelectric element shown in FIG. 1, a central portion of each of the second upper and lower partition wall portions 10 as at least a part of the partition wall constituting the second through-hole 8 is made of the conductive material 5. The p-type semiconductor material 2 and the n-type semiconductor material 3 are connected by the insulating material 4 and the conductive material 5. By so constructing, contact resistance between the p-type semiconductor material 2 and the n-type semiconductor material 3 can be reduced, loss in flowing current caused by the electromotive force in each of the thermoelectric element unit can be reduced, and the electric power generating efficiency can be enhanced.

As the electrically conductive material 5, a material having excellent electric conductivity such as gold, silver, copper, nickel, aluminum, molybdenum and iron may be used.

However, the conductive material 5 is not necessarily required. For example, if a p-type semiconductor material such as cobalt-added iron silicite is connected with an n-type semiconductor material such as manganium-added iron silicite, a contact resistance can be almost neglected at an interface between them. Therefore, no conductive material needs be provided. Thus, in this case, the p-type semiconductor material 2 and the n-type semiconductor material 3 can be bonded directly to each other.

The honeycomb-shaped thermoelectric element as one of the p-type semiconductor materials, which is made of the p-type semiconductor material and the n-type semiconductor material, has been explained above. However, the honeycomb-shaped structural body according to the present invention is not limited to the thermoelectric element, and the electric element can be employed as an element such as a Peltier element, an electric heater or an electrochemical cell.

In this case, lanthanum chromite, lanthanum manganite, zirconia, barium titanate and molybdenum silicate may be used as the conductive material instead of the p-type and n-type semiconductor materials.

(Experiments)

In the following, the present invention will be concretely explained based on the following experiments.

EXAMPLE

In the present examples, a thermoelectric element as shown in FIG. 1 was formed.

Iron silicite added with manganese and aluminum was used as a p-type semiconductor material 2, and iron silicite added with cobalt and nickel was used as an n-type semiconductor material 3. A mixture of alumina and silicon dioxide was used as an insulating material 4, and copper used as an electrically conducting material 5.

(Production of Bodies)
(Body of Iron Silicide Added with Manganese and Aluminum)

To 100 parts by weight of iron silicide added with manganese and aluminum was mixed 3 parts by weight of methyl cellulose and polyvinyl alcohol. To the resulting mixture was added 14 parts by weight of water, and a kneaded mixture was obtained by a kneader. The kneaded mixture was placed in a vacuum pug mill where a body containing the p-type semiconductor material was produced in a cylindrical shape of 50 mm in diameter and 300 mm in length.

(Body of Iron Silicide Added with Cobalt and Nickel)

In the same way as mentioned above, to 100 parts by weight of iron silicide added with cobalt and nickel was mixed 3 parts by weight of methyl cellulose and polyvinyl alcohol. To the resulting mixture was added 14 parts by weight of water, and a kneaded mixture was obtained by a kneader. The kneaded mixture was placed in a vacuum pug mill where a body containing the n-type semiconductor material was produced in a cylindrical shape of 50 mm in diameter and 300 mm in length.

(Body of a Mixture of Alumina and Silicon Dioxide)

In the same way as mentioned above, to 100 parts by weight of a mixture of alumina and silicon dioxide was mixed 10 parts by weight of methyl cellulose and polyvinyl alcohol. To the resulting mixture was added 10 parts by weight of water, and a kneaded mixture was obtained by a kneader. The kneaded mixture was placed in a vacuum pug mill where a body containing the insulating material was produced in a cylindrical shape of 20 mm in diameter and 300 mm in length.

(Copper Body)

To 100 parts by weight of copper powder having the grain size of 3 to 10 $\mu$m was mixed 10 parts by weight of methyl cellulose and polyvinyl alcohol. To the resulting mixture was added 20 parts by weight of water, and a kneaded mixture was obtained by a kneader. The kneaded mixture was placed in a vacuum pug mill where a body containing the electrically conductive material was produced in a cylindrical shape of 20 mm in diameter and 300 mm in length.

(Production of Honeycomb-shaped Molded Body)

The bodies produced above were filled into plural cylinders of four-shaft extruding plungers, respectively, and were extruded into a honeycomb-shaped molded body through a die provided at a tip of an extruder, while the hydraulic pressures of the plungers were being controlled to make the extruding speeds of the respective bodies substantially equal to each other.

(Production of Honeycomb-shaped Thermoelectric Element)

Then, after the molded body was dried at 100° C., the dried body was sintered at 1100° C. for 4 hours and further heated at 900° C. for 50 hours, in a hydrogen atmosphere, thereby obtaining a honeycomb-shaped thermoelectric element as shown in FIG. 1, which included a honeycomb-shaped structural body.

The honeycomb-shaped structural body 1 constituting the thermoelectric element had a height H of 2.5 cm and a width W of 4.5 cm with a partition wall thickness d of 0.5 mm. The length "r" of one side of each of through-holes 7 and 8 each having a square sectional shape was 2.5 mm. Further, the thermoelectric element had a longitudinal length L of 5.0 cm. The number of the through-holes were such that there were 9 lateral holes and 4 vertical holes different from FIG. 1.

(Measurement of an Intensity of Generated Electric Power of the Honeycomb-shaped Thermoelectric Element)

Air at a temperature of 680° C. was flown through the first through-holes 7 of the thus formed thermoelectric element, while air at a temperature of 100° C. flown through the second through-holes 8. Electric power was generated in the above thermoelectric element due to a difference in temperature of these airs, which was measured to be 11.8 W with an intensity of generated electric power per unit volume of 0.21 W/cm$^3$.

Comparative Example

A thermoelectric element composite was formed by connecting thermoelectric elements, each having a single kind of through-holes with a height of 2.5 cm, a width of 4.5 cm, a length of 5.0 cm, a partition wall thickness of 0.5 mm as in Example at a number of 6 in a lateral direction and at a row number of 2 in a vertical direction.

Airs at 680° C. and 100° C. were flown through the respective two rows of the thermoelectric elements as in the above Example, and the intensity of the electric power generated due to the temperature difference was measured. As a result, the intensity of the electric power generated was 6.8 W with an intensity of the generated electric power per unit volume of 0.1 W/cm$^3$.

As is understood from the above Example and Comparative Example, the honeycomb-shaped thermoelectric element according to the present invention has a large intensity of electric power generated per unit volume, so that the intensity of the electric power generated through the entire thermoelectric element is extremely large.

In the above, the present invention has been explained based on the embodiment of the present invention with reference to the specific example, but the present invention is not limited to the above-mentioned contents. Any changes and modifications are possible so long as they do not fall outside the scope of the present invention.

As explained above, each of the electric element and the thermoelectric element according to the present invention is constituted by the honeycomb-shaped structural body. A plurality of the electric element units or the thermoelectric element units are formed directly by the materials constituting the honeycomb-shaped body. Therefore, each of the electric element and the thermoelectric element has the structure in which a plurality of the electric element units or the thermoelectric element units are connected to one another in series and in parallel at a high density. By this, the electric element having a high output density and the thermoelectric element having a high electric power generated density can be obtained.

What is claimed is:

1. A honeycomb-shaped electric element comprising a honeycomb structural body having a height, a width and a length; crossing partition walls extending the length of the body, the walls defining through holes for passage of material in the direction of the length of the body, the partition walls having cross-sectional portions made of material selected from the group consisting of conductive and insulative material, the selected material being alternatively and adjacently placed in the walls of the through holes to allow a current to flow in the direction of the width of the body in a non-linear path.

2. The honeycomb-shaped electric element set forth in claim 1, wherein said partition walls are vertical partition walls, a first type of vertical partition wall being made of a p-type electrically conductive material and a second type of vertical partition wall being made of an n-type electrically conductive material, said first type of vertical partition wall and said second type of vertical partition wall being substantially alternatively arranged as viewed in a width direction of the honeycomb structural body, said first and second types of vertical partition wall are connected to an adjacent vertical partition wall by an insulative material and an electrically conductive material arranged in a way permitting an electric current to flow in the direction of the width of the honeycomb structural body in a non-linear path.

3. The element set forth in claim 1, wherein said current flow passage is a wavy form through the partition wall portions of the through-holes between a first line of the through-holes and a third line of the though-holes via a second line of the through-holes, the first, second and third being arranged in this order.

4. The element set forth in claim 1, further comprising electric element units inside the honeycomb-shaped structural body, the electrically conductive material and the insulating material in combination forming the element units, and the electric element units connected in series and in parallel to form a circuit.

5. The element of claim 1, wherein the electrically conductive material comprises a p-type semiconductor material and an n-type semiconductor material, and further comprising thermoelectric element units inside the body, and the element units connected to one another in series and in parallel to form a circuit.

6. The honeycomb-shaped thermoelectric element according to claim 5, wherein the p-type semiconductor material is at least one selected from the group consisting of cobalt oxide, lanthanum ferrite, lanthanum manganite, silicon germanium, cobalt antimony, bismuth tellurium, lead tellurium and iron silicide, and the n-type semiconductor material is at least one selected from the group consisting of lanthanum cobaltite, lanthanum chromite, silicon germanium, cobalt antimony, bismuth tellurium, lead tellurium and iron silicide.

7. The honeycomb-shaped thermoelectric element set forth in claim 6, wherein an electrically conductive material is interposed at each of those contacts between the p-type semiconductor material and the n-type semiconductor material.

8. The honeycomb-shaped thermoelectric element set forth in claim 5, wherein an electrically conductive material is interposed at each of those contacts between the p-type semiconductor material and the n-type semiconductor material, said electrically conductive material ensuring electric connection between the p-type semiconductor material and the n-type semiconductor material.

* * * * *